United States Patent
Yates et al.

(10) Patent No.: US 6,342,308 B1
(45) Date of Patent: Jan. 29, 2002

(54) COPPER FOIL BONDING TREATMENT WITH IMPROVED BOND STRENGTH AND RESISTANCE TO UNDERCUTTING

(75) Inventors: Charles B. Yates, Princeton; George Gaskill, Manahawkin, both of NJ (US); Chinsai T. Cheng, Orange, CT (US); Ajesh Shah, West Windsor, NJ (US)

(73) Assignee: Yates Foil USA, Inc., Bordentown, NJ (US)

( * ) Notice: Subject to any disclaimer, the term of this patent is extended or adjusted under 35 U.S.C. 154(b) by 0 days.

(21) Appl. No.: 09/408,170

(22) Filed: Sep. 29, 1999

(51) Int. Cl.[7] .............................. B32B 15/20; C25D 7/06
(52) U.S. Cl. ..................... 428/607; 428/612; 428/626; 428/658; 428/675; 205/111; 205/176; 205/177; 205/182; 205/239
(58) Field of Search ................................ 428/606, 607, 428/612, 626, 637, 658, 675, 687; 205/111, 176, 177, 182, 239

(56) References Cited

U.S. PATENT DOCUMENTS

| | | | |
|---|---|---|---|
| 3,857,681 A | | 12/1974 | Yates et al. .................. 29/195 |
| 3,918,926 A | * | 11/1975 | Wolski et al. ................ 29/195 |
| 4,456,508 A | * | 6/1984 | Torday et al. ................ 204/27 |
| 4,469,567 A | * | 9/1984 | Torday et al. ................ 204/27 |
| 4,572,768 A | | 2/1986 | Wolski et al. ................ 204/15 |
| 4,915,797 A | * | 4/1990 | Vigezzi et al. ............... 204/28 |
| 5,207,886 A | | 5/1993 | Wolski et al. ............... 205/155 |
| 5,332,486 A | * | 7/1994 | DiFranco .................... 205/50 |
| 5,679,230 A | * | 10/1997 | Fatcheric et al. ............. 205/50 |
| 6,060,666 A | * | 5/2000 | Thorpe ...................... 174/255 |

FOREIGN PATENT DOCUMENTS

| | | | |
|---|---|---|---|
| EP | 0112635 | * | 7/1984 |
| GB | 2030176 | * | 4/1980 |
| JP | 4-318996 | * | 11/1992 |
| JP | 4-318997 | * | 11/1992 |

OTHER PUBLICATIONS

Bulow, C. L., "Copper–Zinc Alloys: Dezincification," *The Corrosion Handbook*, John Wiley & Sons, Inc., 1948, pp. xxvii, and 69–70. (No month).

Evans, Ulick R., "Boilers and Condensers: Dezincification," *The Corrosion and Oxidation of Metals: Scientific Principles and Practical Applications*, Edward Arnold (Publishers) Ltd., 1960, pp. 475–476. (No month).

* cited by examiner

Primary Examiner—John J. Zimmerman
(74) Attorney, Agent, or Firm—Finnegan, Henderson, Farabow, Garrett & Dunner, L.L.P.

(57) ABSTRACT

A treated electrodeposited copper foil having a bond-enhancing copper layer, preferably a plurality of layers, electrodeposited on a bonding side of a base copper foil, a layer of co-deposited copper and arsenic electrodeposited on the bond-enhancing layer, and a zinc or zinc alloy layer electrodeposited on the copper/arsenic layer. A process for making such foil, and a copper-clad laminate wherein such foil is bonded to a polymeric substrate.

13 Claims, 3 Drawing Sheets

BEFORE MICROCRYSTALINE TREATMENT

AFTER MICROCRYSTALINE TREATMENT

BEFORE LAMINATION

AFTER LAMINATION

FORMATION OF ARSENICAL BRASS
(INTERDIFFUSION OF Cu/Zn/As)

COPPER FOIL BONDING TREATMENT WITH IMPROVED BOND STRENGTH AND RESISTANCE TO UNDERCUTTING

FIELD OF THE INVENTION

This invention relates to copper foil for use in manufacturing printed circuit boards, and, especially, to electrodeposited copper foil having a bonding side to be bonded to a polymeric substrate wherein the bonding side is provided with a copper bond-enhancing treatment layer, a copper-arsenic layer deposited on the bond-enhancing layer, and a zinc-containing layer deposited on the copper-arsenic layer. This invention also relates to copper clad laminates made with such foil, and to a process for producing such foil.

BACKGROUND OF THE INVENTION

Typically, a bonding treatment is effected by subjecting the bonding side, usually the matte side, of a "raw" electrodeposited copper foil to four consecutive electrodeposition steps. The first consists of the deposition of a micro-dendritic copper layer which enhances, to a very large degree, the real surface area of the matte side, and thus enhances the foil's bonding ability. It is followed by electrodeposition of an encapsulating, or gilding, copper layer, whose function is to reinforce mechanically the dendritic layer and thus render it immune to the lateral shear forces of liquid resins occurring in the laminating stage of printed circuit board (PCB) fabrication. The encapsulating step of the treatment is very important, since it eliminates the foil's tendency toward "treatment transfer" and the resulting "laminate staining" which can cause a decrease of the dielectric properties of copper-clad laminates. The shape, height, mechanical strength and the number of dendritic microprojections per unit of surface area which constitute the dendritic deposit are the factors instrumental in achieving adequate bond strength of the foil, after all stages of the treatment are completed, when the foil is bonded to a polymeric substrate. The role of the second treatment stage, is to reinforce mechanically, the fragile dendritic layer, by overplating it with a thin layer of sound and strong metallic copper, which locks the dendrites to the base foil structure. Such a dendrites-encapsulation composite structure ought to be characterized by high bond strength and the absence of treatment transfer. The treating parameters which assure just that are relatively narrow. If the amount of the encapsulating, or gilding deposit is too low, the foil will be given to treatment transfer, and, if on the other hand, the gilding layer is too thick, a partial loss of peel strength may be expected. In these first two steps of the treatment the layers are composed of pure copper, in the form of microscopic, spherical micro-projections.

The electrodeposition of the copper bonding treatment is typically followed by deposition of a very thin layer of zinc or zinc alloy, a so-called barrier layer. Its purpose is to prevent direct copper-epoxy resin contact and that is why the zinc-alloy layer (which during lamination is converted to alpha brass), is called the barrier layer. If the bonding treatment composed of copper only is subjected to lamination with epoxy resin systems, it tends to react with amino groups of the resin, at the high laminating temperatures. It, in turn, creates moisture at the foil-resin interface, causing the harmful effect of "measling" and possibly delamination. A barrier layer which is plated over all-copper treatment prevents these harmful effects entirely. All three stages of the treatment mentioned above, effected by means of electrodeposition, change the geometry and morphology of the matte side of the foil, assuring the desired mechanical strength of the surface region, as well.

The electrodeposition of the treatment is usually followed by an electrochemical stainproofing which changes the surface chemistry. As a result of this step, the bonding surface is rendered chemically stable. This operation removes weak surface films, which can greatly decrease the adhesion of the solids, and replaces the films with a stable film of controlled thickness, which is responsible for imparting "durability" of its properties to the treated surface. The film serves as an undercoat for subsequent bonding. The same stainproofing step protects the opposite shiny side of the foil against atmospheric oxidation.

Contemporary bonding treatments were invented in the early 1970's and major foil manufacturers are using the same techniques today. The changes that have occurred in the intervening years pertain, by and large, to the composition of the barrier layers, to accommodate technical needs imposed by the emergence of new polymeric dielectric substrates used in the manufacture of PCBs. For example, polyimide substrates introduced to the printed circuit industry fairly recently require a much higher laminating temperature than the epoxy pre-pregs. Consequently, foil manufacturers had to modify a portion of the overall treating processes in order to achieve the composition and performance of barrier layers for the foils that are destined for polyimide applications. Simply speaking, barrier layers on polyimide-grade treatments have to withstand much higher laminating and post-bake temperatures, compared to the treatments destined for epoxy applications. High temperature at the metal-polymer adhesion. A well-designed barrier layer will be self-protected along with the underlying all-copper treatment from heat oxidation and the loss of bond.

Other changes in the technology of the bonding treatment are continuing to occur. For example, some major foil manufacturers build their new treaters with a larger number of individual plating tanks, in order to apply twice the sequence of dendritic deposit followed by encapsulating deposit. Thus, quite often, the first four tanks of the treater are designated and devoted to the application of micro-roughening treatment that consists of a dendritic layer followed by an encapsulation layer and this composite plural layer is repeated twice. This practice is aimed at being able to run the treater at greater speeds, since the initial capital outlay for the construction of the treaters is very high today. Conversely, the larger the number of tanks, with the treater run at more traditional speeds, permits deposition of a greater mass or weight of the treatment to assure acceptable peel-strength on so-called "difficult to bond to" polymeric substrates that aim at higher glass transition temperatures. These substrates, which often are blends that involve multifunctional epoxies, BT resin, polyimide, etc., usually require an increased amount of bonding treatment to assure adequate peel-strength. It should be remembered that aside from its bond-enhancing microstructure, the amount of treatment per surface area of copper foil is also an important factor.

It is estimated that foil manufacturers usually electrodeposit about 5 grams of dendritic deposit per square meter of copper foil and about the same amount of encapsulating deposit, while the mass of the barrier layer is usually about 1 gram per square meter. The amount of treatment deposited on the matte side of the foil, depends on the current density and the plating time as determined by Faraday's Law. Current density cannot be increased excessively to accommodate higher treater speeds, since the copper foil has to carry the current between the contact rollers and the plating electrolyte.

Excessive currents will cause over-heating of the foil with resulting wrinkling, cosmetic defects, etc. It follows then that the plating time cannot be rendered too short, to accommodate high treater speeds, because the amount of the bonding treatment that has to be deposited is an important consideration. As a result, the treater speeds, although they vary among major foil manufacturers, do not exceed about 100 ft/min. Since a drum-cathode machine operated with a current of about 50,000 amps, produces about 60" wide, 1 ounce foil at a rate of about 10 feet/min. and twice that speed for ½ ounce foil, it follows that one modern treater can process the output of 5 to 8 drum machines, depending on the mix of foil gauges, down times, etc. Aside from a degree of the engineering evolution of the treating machines, and to a lesser degree, the treatment process itself, the very concept and mode of the execution of the bonding treatment process, remains much the same since it was invented.

Techniques for the production of electrodeposited copper foil are well-known, as are techniques for electrodepositing bonding treatments on such foil. For example, U.S. Pat. No. 3,857,681 (Yates et. al.) "Copper Foil Treatment and Products Produced Therefrom" is an excellent source of know-how for the bonding treatment technology. This patent discloses sequential, plural layer bonding treatment technology which involves the succession of dendritic-powdery deposit, encapsulating deposit and the barrier layer. The barrier layer, according to the Yates et al. patent and as practiced today by major foil manufacturers, consists of a thin layer of zinc alloy distributed uniformly over the micro-profile of the all-copper bonding treatment. This zinc-alloy layer, i.e., barrier layer, can be either plated "as is" or created by the heat accelerated diffusion of the metals. Some foil manufacturers electrodeposit a brass barrier layer. Others electrodeposit zinc. In this case, the foil delivered to the laminating plants has the bonding side characterized by a uniform gray color. Since the laminating process involves heat in the course of fabrication of copper clad laminates destined for PCBs, the zinc barrier layer alloys with the underlying all-copper bonding treatment by the process of heat-accelerated diffusion of metals in the solid state. As a result, a layer of yellow, chemically stable alpha brass is thus formed over the surface of all-copper surface. Thus, the Yates patent discloses the formation of the zinc alloy layer by either direct plating of brass, of the diffusion formation of brass. In recent years, major foil manufacturers have introduced minor additional alloying elements to improve the performance of the barrier layer with respect to high temperatures of lamination required in the fabrication of polyimide laminates, high temperature post-bakes, etc.

Metals like nickel, cobalt, tin, etc., may be co-deposited with zinc to achieve these goals.

Unskillful application of the barrier layer in the bonding treatment process can create the effect of under-cutting or "red-ring" in the fabrication of PCBs. Red-ring undercut can be easily recognized when the conductor lines peeled back from the laminate surface exhibit pink outside margins quite different from the yellow color of un-attacked brass. Usually the wrong composition of brass alloy is at fault, and the resulting ill effects can be serious. Etching solutions can enter into the foil-epoxy interface, i.e., creep underneath conductor lines, leach out zinc from the brass layer and in effect diminish the functional width of the treated side of the foil that actually bonds track lines to the polymeric substrate. An example: If the track line is 5 mil wide and the ingress of etching solution is a 1 mil on each side, then ⅔ of the potentially available bonding force is lost. Cupric chloride etchant with the addition of hydrochloric acid is the most aggressive promoter of "red-ring" undercut. 0.1 mm copper conductor lines (or 4 mil lines) usually have a peel strength lower than $\frac{1}{100}$ of the peel strength, as tested on 1 cm wide (or $\frac{1}{250}$ for 1 inch) strip of the clad laminate. This is so, because in the fabrication of the PCBs, the etching solution used to remove un-masked portions of the copper foil, tend to enter underneath conductor lines, leading to "undercutting" and partial dis-bonding. The actual width of the bonded foil-polymer interface becomes narrower than the width defined by the photoresist image, and the peel strength is partially diminished. This obviously undesirable phenomenon can be eliminated. Red ring undercut is a textbook case of the corrosion of metal by mineral acids and etching solutions used in the fabrication of PCBs, through the process of "dezincification." As the name implies, zinc is lost from the alloy, leaving as a residue, or by a process of redeposition, a porous mass of copper having little mechanical strength.

Arsenic is a metal which, when added to brasses, e.g., those containing more than 15 wt % zinc, is most effective in preventing dezincification, and arsenic is added routinely (for the purpose of improving corrosion resistance) to metallurgical brasses, i.e., those produced by melting of metals.

However, in practice zinc/arsenic alloy co-deposition is not known or predicted, except perhaps by the use of cyanide electrolytes, which are expensive and pose complex and even more expensive problems of waste water treatment and compliance with environmental laws.

SUMMARY OF THE INVENTION

A primary object of the present invention is a treated copper foil which, when bonded to a polymeric substrate, has an improved bond strength to the substrate and provides good resistance to undercutting by acids used in etching to form electrical circuitry on copper-clad laminates made with the foil.

Another object of the invention is a copper-clad laminate made with the above foil which enables a durable, high strength bond between the foil and its substrate.

Still a further object of the invention is a process for electrodepositing a treatment on a bonding side of an electrolytic copper foil, which treatment provides an improved bond strength and resistance to undercutting.

Other objects and advantages of the invention may become apparent from the following description and from practice of the invention.

The objects of the invention may be achieved by a treated copper foil for use in the manufacture of printed circuit boards, which comprises an electrodeposited copper base foil having a bonding side upon which there is deposited a bonding treatment which includes a copper bond-enhancing treatment layer electrodeposited on the bonding side; a copper-arsenic layer electrodeposited on the bond-enhancing treatment layer; and a barrier layer of zinc or a zinc alloy electrodeposited on the copper-arsenic The above treated copper foil may be produced by a process for electrodepositing a treatment on a bonding side of a copper base foil, which process comprises electrodepositing a bond-enhancing copper treatment layer on a bonding side of the base foil; co-electrodepositing copper and arsenic on the bond-enhancing treatment from an electrolyte containing copper ions and arsenic ions under electrodeposition conditions effective to deposit thereon a copper-arsenic alloy layer; and electrodepositing zinc or a zinc alloy on the copper-arsenic layer to deposit thereon a zinc or zinc alloy barrier layer.

BRIEF DESCRIPTION OF THE DRAWINGS

The invention will be more fully understood from the following description thereof read in conjunction with the accompanying drawings, in which.

DESCRIPTION OF PREFERRED EMBODIMENTS

Figure 1:
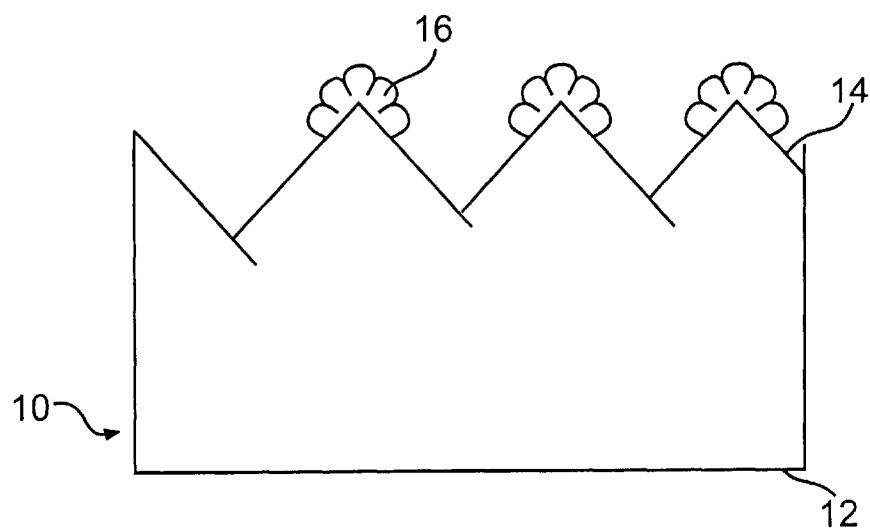
FIG. 1 is a side view of conventional electrodeposited copper foil with a bond-enhancing copper treatment electrodeposited on the matte side of the foil.
Figure 2:
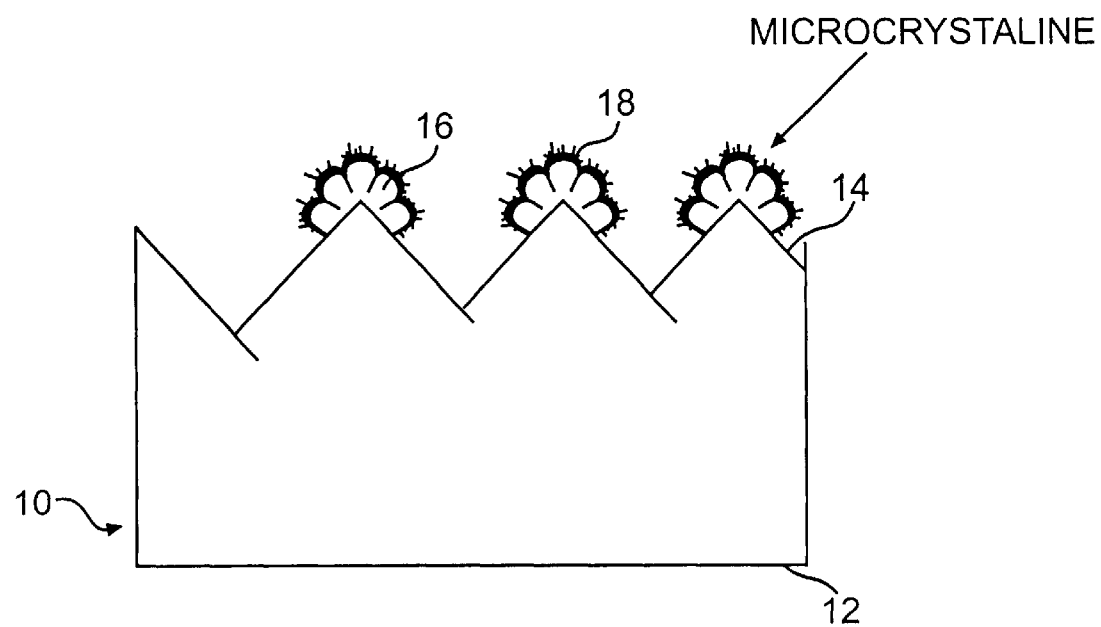
FIG. 2 is a side view of treated copper foil in accordance with the present invention.

Referring to FIGS. 1 and 2, an electrodeposited copper base foil 10 is produced on a rotating drum-cathode by a well-known process, and it has a shiny side 12, or drum side, and matte side 14 (the side facing the electrolyte) with a velvety finish formed of, on a micro-scale, peaks and valleys. A bond-enhancing copper treatment layer 16 is electrodeposited on a bonding side of the foil (the side to be bonded to a polymeric substrate when forming a copper-clad laminate for the manufacture of PCBs), which may be either the matte side or the shiny side, but preferably is the matte side. Treatment 16 preferably is formed of a plurality of electrodeposited layers, e.g., a copper dendritic layer followed by a gilding (or encapsulating) copper layer. The purpose of treatment 16 is to enhance the bond strength of the foil to a polymeric substrate when a copper-clad laminate is formed. The copper bond-enhancing treatment 16 can be deposited by any suitable technique, for example, the technique disclosed in U.S. Pat. No. 3,857,681 (Yates et al.), which is incorporated herein by reference.

In accordance with the present invention a microcrystalline copper-arsenic layer 18 is electrodeposited on the treatment layer 16, as described herein below.

Figure 3:
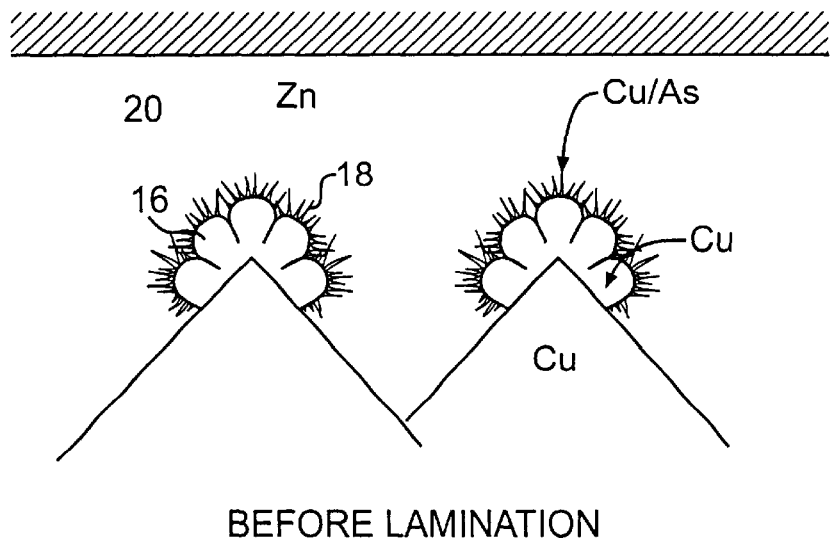
FIG. 3 is a partial side view of a copper-clad laminate in accordance with the invention prior to heating.

As shown in FIG. 3 a zinc or zinc alloy barrier layer 20 is then electrodeposited on microcrystalline layer 18, using a well-known method, preferably the method disclosed in the above-mentioned U.S. Pat. No. 3,857,681.

In accordance with the present invention arsenic is introduced into a barrier layer (initially composed of zinc or zinc alloy), by:
1. electrodeposition of a copper/arsenic microcrystalline deposit, prior to the deposition of a barrier layer
2. deposition of a zinc-containing barrier layer
3. formation of a copper/arsenic/zinc ternary alloy (arsenical brass) by interdiffusion of three metals in the course of lamination of the copper foil to the polymeric substrate.

This "bonding" (lamination) operation is accomplished in laminating plants and involves heating and cooling cycles. Sheets of copper foil are laid on sheets of "prepreg" (e.g., glass fabric impregnated with epoxy resin). Both materials are placed in a hydraulic press with heated pressing plates and pressed together under high pressure. At elevated temperatures, the resin liquefies and is forced, by pressure, into micro-irregularities of the foil surface. This is followed by a second cycle where both materials are cooled while pressure is maintained. The resin solidifies in the irregularities of the foil surface to firmly bond both materials together, making them very difficult to pull apart. The laminating temperatures depend on the type of the polymeric substrate but are in general of the order of 350 –450° F. The heat is applied for several hours.

Figure 4:
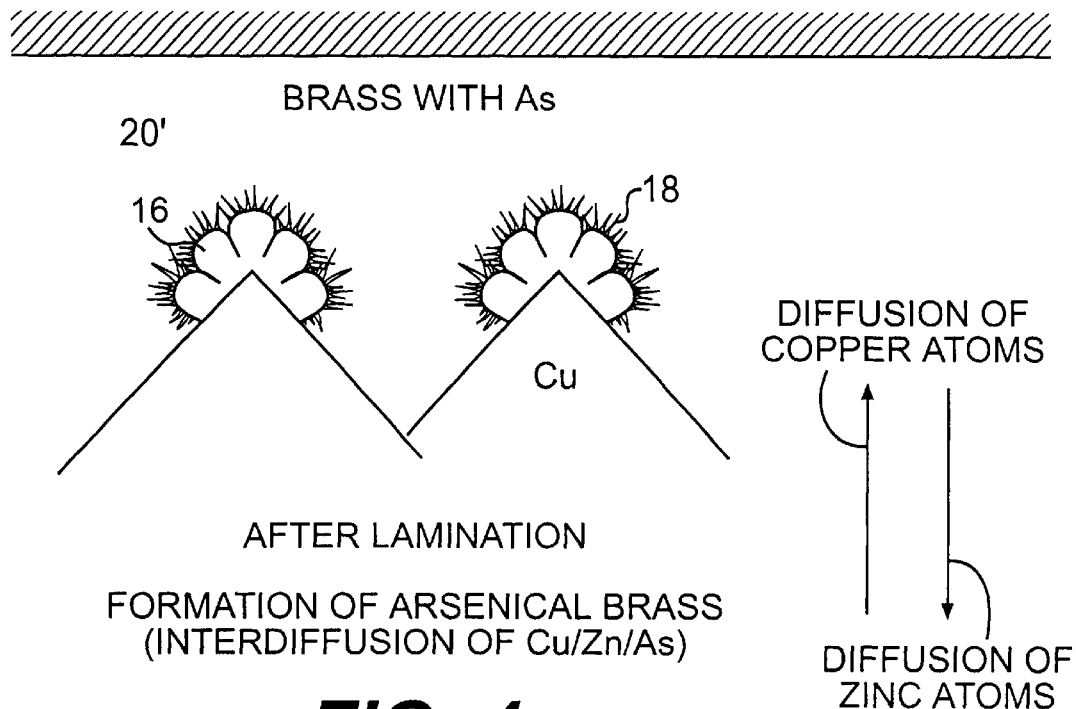
FIG. 4 is a partial side view of a copper-clad laminate in accordance with the invention after being heated.

As a result of heat-accelerated inter-diffusion of copper, zinc and arsenic atoms, these metals form a ternary alloy, arsenical brass, which is resistant to dezincification and undercutting of copper track (conductor) lines in the manufacturing of printed circuit boards. In the diffusion it is estimated that approximately one-third of the heat-formed brass layer growth is into the copper-arsenic layer, and two-thirds of the growth is into the zinc-containing layer. As shown in FIG. 4, after lamination an arsenical base barrier layer 20' is formed by the solid-to-solid diffusion, and a portion of the microcrystalline deposit 18 may remain on the bonding treatment 16 with its composition altered by the diffusion.

The microcrystalline layer has been found to also provide a significant improvement in peel-strength (bond-strength) of copper foil when it is bonded to a polymeric substrate.

Figure 5:
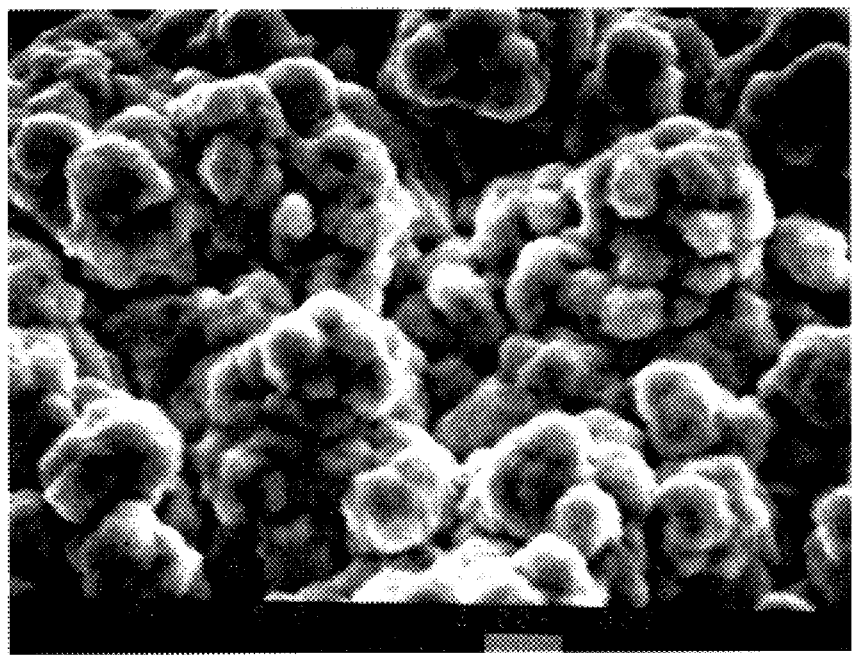
FIG. 5 is a microphotograph (5000x) of the surface of a conventional bonding treatment.

As it is shown on the accompanying electron microscope photographs, i.e., FIG. 5, and schematic drawings, e.g., FIG. 1, the basic shape of an individual treatment particle 16 is a sphere whose average diameter is about 2 microns (when treatment is applied as per prior art: U.S. Pat. Nos. 3,857, 681, 4,572,768, or 5,207,889).

Figure 6:
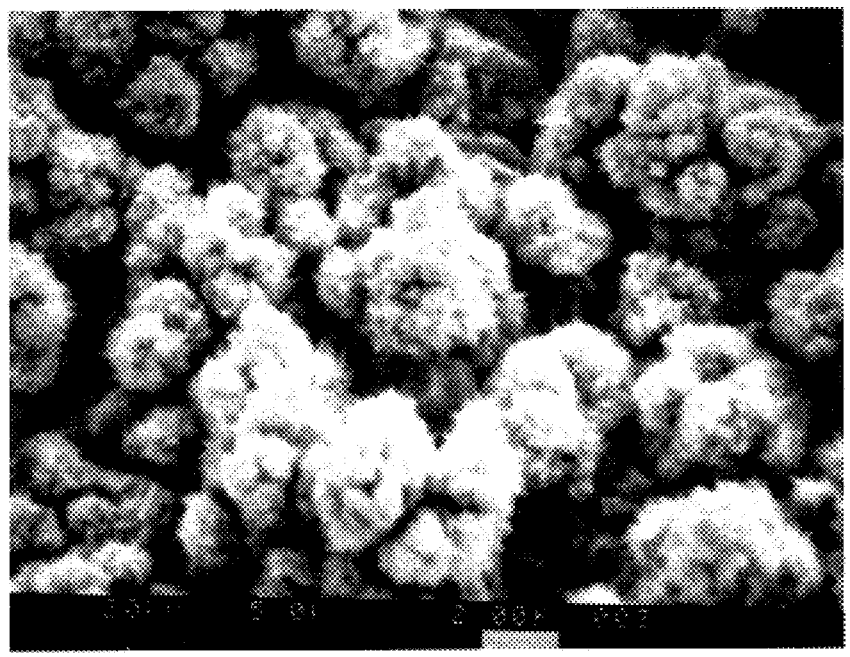
FIG. 6 is a microphotograph (5000x) of the surface of a bonding treatment in accordance with the present invention.

However, in the bonding treatment according to the present invention as shown in FIGS. 2 and 6, for example, the spheres formed by combination of dendritic and encapsulating layers, are in addition covered by needles (or whiskers), of the microcrystalline layer 18. These needles are an average 0.2 microns in diameter and 0.6 microns in height. This, in addition enlarges the true surface area available for bonding and increases the roughness factor of the bonding treatment (the ratio of the true surface area to the apparent or projected area). Thus, a higher bond strength is achieved.

The following examples further illustrate the present invention and demonstrate its advantages.

EXAMPLE

A web of 1 ounce (35 microns thick) electrodeposited raw copper foil was processed through a treater machine, in order to provide the matte side of the raw foil with a bonding treatment.

Treatment parameters conforming to those disclosed in U.S. Pat. No. 3,857,681 "Copper Foil Treatment and Products Produced Therefrom" to Yates et al. were used to produce a treated foil, designated as Foil No. 1, having a copper dendritic layer/gilding layer and a zinc barrier layer electrodeposited on the matte side.

Another portion of the web of the same raw foil was subjected to the identical treatment, except that after the gilding layer plating tank, an additional plating station, was used to electrodeposit the present copper-arsenic microcrystalline layer, before the barrier layer was applied in the usual manner. The most preferred conditions shown in the following Table 1 were used to apply the microcrystalline layer.

This latter treatment was designated as Foil No. 2.

TABLE 1

PARAMETERS OF THE PROCESS AND THE ELECTROLYTE FOR ELECTRODEPOSITION OF COPPER/ARSENIC MICROCRYSTALLINE LAYER

| PARAMETER | MOST PREFERRED | PREFERRED RANGE |
| --- | --- | --- |
| Cu as $CuSO_4$ | 5 g/l | 4–8 g/l |
| As as $H_3AsO_4$ | 250 ppm | 200–300 ppm |
| $H_2SO_4$ | 40 g/l | 35–45 g/l |
| Chloride | 8 ppm | 5–20 ppm |
| Temperature | Ambient | 15–30° C. |
| Current Density | 6 $A/dm^2$ | 4–8 $A/dm^2$ |
| Time | 5 sec. | 3–8 sec. |
| Cu in the Deposit | 0.59 $g/m^2$ | 0.3 $g/m^2$ – 1.0 $g/m^2$ |
| As in the Deposit | 0.013 $g/m^2$ | 0.005 $g/m^2$ – 0.05 $g/m^2$ |

Foils No. 1 and No. 2 were tested for peel-strength (bond strength) and resistance to undercutting, after being laminated to FR-4 epoxy polymeric substrate (prepreg of glass fiber and epoxy resin, designated FR-4 by the National Electrical Manufacturers Association—NEMA).

Bond strength was measured as follows: The foil was bonded to an epoxy resin-impregnated fiberglass support in a conventional manner. The epoxy resin was used in its "B" stage and was cured in contact with the treated surface of the foil under a pressure of about 500 psi at about 330°–340° F. The final thickness of the laminate over approximately 1/16th of an inch with the foil comprising about 0.0015 inches of this total. The laminate so constructed was then cut into ½ inch wide strips and subjected to bond strength tests in the following manner: Copper was peeled from the glass cloth support at a rate of 2 inches per minute in a direction perpendicular to the laminate. The force required to peel the copper from the support was read on a force gauge and was measured in pounds of force. This reading was doubled to obtain the peel strength per inch of width of laminate. A bond strength of 10 lbs./in. of width of laminate is deemed to be very acceptable. A bond strength of 12 lbs./in. or more is deemed to be exceptional.

Resistance to undercutting was tested by applying strips of 1 mm wide acid resistant tape on the foil of the resulting laminate and etching the laminated foil in cupric chloride to produce two lines of bonded copper, each 1 mm wide. One of the lines was pulled from the prepreg by a force that was measured. The remaining line was subjected to a bath of 1:1 hydrochloric acid at room temperature for one hour, then pulled from the prepreg. The difference in the measured forces provided an indication of how the foil resisted undercutting. Measured results for Foil No. 1 and No. 2 are given in the following Table 2.

TABLE 2

| | Bond Strength lbs/inch | Bond Strength lbs/mm | Bond Strength after HCl lbs/mm | Bond Strength loss % |
| --- | --- | --- | --- | --- |
| | | Undercutting | | |
| Foil No. 1 | 10.6 | 0.41 | 0.35 | 13 |
| Foil No. 2 | 12.2 | 0.48 | 0.48 | 0 |

There are two important benefits derived from the present cooper-arsenic microcrystalline deposit which follows the gilding layer and precedes the zinc barrier layer in the sequence of treatment steps of the invention.

1. The microcrystalline layer, plated over spherical microprojections of dendritic and encapsulating layers composite, increases the total surface area available for bonding to polymeric substrates, and thus increases bond strength of the treatment.

2. The microcrystalline layer is composed of copper-arsenic alloy (e.g., about 98% Cu, 2% As). The arsenic component of the layer takes part in interdiffusion of atoms of copper and zinc provoked by the heat of the laminating process, which results in formation of a brass barrier layer that contains arsenic. This barrier layer is immune to undercutting by etching solutions used in manufacturing of printed circuit boards.

The main features of the electrolyte and the process for the deposition of microcrystalline layer are:

very low copper concentration low temperature high current density absence of vigorous agitation presence of chloride ions All these factors lead to the high cathode polarization and poor mass transport which enhance formation of so-called field-oriented isolation type polycrystalline electrodeposits that take form of needles, whiskers and prismatic crystals which contribute toward improved bond strength of the treatment.

Therefore, while the present process may be carried out using the above guidelines to deposit the Cu—As layer having the above structure, we have found that use of the preferred ranges of process parameters and electrolyte composition shown in Table 1 enables deposition of particularly satisfactory Cu—As layers.

Co-deposition of arsenic is achieved by introduction into the electrolyte of arsenic in the form of ortho-arsenic acid $H_3AsO_4$, of rather low concentration. We found that a mere 2% of As in the microcrystalline deposit is enough to effect immunity to undercutting; however, it may be found desirable to use other amounts, for example, from about 0.5 to 5 wt % As.

Co-deposition takes place since the standard electrode potentials for copper and arsenic are close to each other, both being more noble than hydrogen.

What is claimed is:

1. A treated copper foil for use in the manufacture of printed circuit boards, which comprises:
   (a) an electrodeposited copper base foil having a bonding side upon which there is deposited a bonding treatment which includes:
   (b) a copper bond-enhancing treatment layer electrodeposited on the bonding side;
   (c) a copper-arsenic layer electrodeposited on the bond-enhancing treatment layer and formed of needles, whisker and/or prismatic crystals of a copper-arsenic alloy, the copper-arsenic layer increasing the true surface area of the treatment layer available for bonding; and
   (d) a barrier layer of zinc or a zinc alloy electrodeposited on the copper-arsenic layer.

2. The copper foil of claim 1, wherein the copper-arsenic layer is composed of, by weight, from about 95% to about 99.5% copper and from about 0.5% to about 5% arsenic.

3. The copper foil of claim 2, wherein the copper-arsenic layer is a copper-arsenic alloy composed of, by weight, about 98% copper and about 2% arsenic.

4. A copper clad laminate comprising a polymeric substrate and the copper foil of claim 1, wherein the substrate is bonded through the bonding treatment to the bonding side of the copper foil.

5. The laminate of claim 4, wherein at least a portion of the barrier layer is a copper-zinc-arsenic alloy formed by solid-solid diffusion.

6. The copper foil of claim 1, wherein the copper base foil has a shiny side and a matte side, and the bond-enhancing treatment layer is electrodeposited on the matte side of the base foil.

7. The copper foil of claim 1, wherein the copper base foil has a shiny side and a matte side, and the bond-enhancing treatment layer is electrodeposited on the shiny side of the base foil.

8. The copper foil of claim 1, wherein the bond-enhancing treatment layer includes a dendritic copper layer deposited on the bonding side of the foil and an encapsulating copper layer deposited on the dendritic layer.

9. The copper foil of claim 1, wherein the bond-enhancing treatment layer is a plurality of electrodeposited copper layers.

10. A process for electrodepositing a treatment on a bonding side of a copper base foil, which process comprises:

(a) electrodepositing a bond-enhancing copper treatment layer on a bonding side of the base foil;

(b) co-electrodepositing copper and arsenic on the bond-enhancing treatment from an electrolyte containing copper ions and arsenic ions under electrodeposition conditions effective to deposit thereon a copper-arsenic alloy layer; and (c) electrodepositing zinc or a zinc alloy on the copper-arsenic layer to deposit thereon a zinc or zinc alloy barrier layer in the form of needles, whiskers and/or prismatic crystals which increase the true surface area of the treatment layer available for bonding.

11. The process of claim 10, wherein the electrolyte comprises an aqueous-sulfuric acid solution containing copper ions, arsenic ions and chloride ions.

12. The process of claim 10, wherein the electrodeposition conditions include the use of an electrolyte which is an aqueous solution containing, per liter of the solution, from about 4–8 grams per liter of copper; from about 200 to about 300 parts per million of arsenic; from about 35 to about 45 grams per liter of $H_2SO_4$; and from about 5 to about 20 parts per million of chloride ions; and wherein there is employed a current density of from about 4 to about 8 amperes per square decimeter, and a plating time of from about 3 to about 8 seconds.

13. The process of claim 10, wherein the copper base foil is an electrodeposited copper foil having a shiny side and a matte side, and the bond-enhancing copper layer is electrodeposited on the matte side.

* * * * *